(12) United States Patent
Vice

(10) Patent No.: US 7,525,384 B2
(45) Date of Patent: Apr. 28, 2009

(54) TRANSMISSION LINE AMPLIFIER

(75) Inventor: Michael Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 281 days.

(21) Appl. No.: 11/581,356

(22) Filed: Oct. 17, 2006

(65) Prior Publication Data

US 2008/0224778 A1    Sep. 18, 2008

(51) Int. Cl.
*H03F 3/60* (2006.01)
(52) U.S. Cl. ........................ 330/286; 330/277; 330/54
(58) Field of Classification Search ................ 330/286, 330/277, 54
See application file for complete search history.

(56) References Cited

U.S. PATENT DOCUMENTS

| | | | | |
|---|---|---|---|---|
| 4,065,782 A | * | 12/1977 | Gray et al. | 257/259 |
| 4,847,568 A | * | 7/1989 | Nazoa-Ruiz | 330/277 |
| 5,072,199 A | * | 12/1991 | Furlow | 333/124 |
| 5,087,898 A | * | 2/1992 | Pyndiah et al. | 333/24 R |
| 5,559,472 A | * | 9/1996 | Kobayashi | 330/293 |
| 6,344,775 B1 | * | 2/2002 | Morizuka et al. | 330/288 |
| 7,053,670 B2 | * | 5/2006 | Muto et al. | 327/65 |
| 7,352,247 B2 | * | 4/2008 | Oh et al. | 330/311 |

* cited by examiner

Primary Examiner—Patricia Nguyen

(57) ABSTRACT

A transmission line amplifier utilizes a transmission line transistor having a gate line, and first and second lines. The gate line is a gate of the transistor, one of the first and second lines is a source of the transistor, and the other is a drain of the transistor. The gate line includes an input terminal at a first end thereof, adapted to receive an input signal, and a gate line load terminal at a second end thereof, adapted to be connected to a gate line load. The second line is connected to a first supply voltage. The first line includes a first line load terminal at a first end thereof that is adapted to be connected to a first line load, and an output terminal at a second end thereof that is adapted to provide an output signal.

19 Claims, 3 Drawing Sheets

TRANSMISSION LINE AMPLIFIER

BACKGROUND

As transistor circuits are called upon to operate into the microwave and millimeter wave frequency ranges over broader bandwidths, the lumped capacitance of the transistors becomes increasingly difficult to tolerate. At frequencies below a few gigahertz the capacitance can be neglected by selecting a process and transistor design that produces a sufficiently small capacitance. Alternatively, when only a narrow bandwidth is required, then the capacitance can be absorbed into a reactive matching network. However, in amplifiers operating across multi-octave bandwidths above a few gigahertz, then neither of the preceding solutions is very effective.

To address this problem, the distributed amplifier was developed. A distributed amplifier is realized by dividing the transistor periphery into an array of smaller devices separated by inductors. These inductors are often realized by narrow width (high impedance) transmission lines. The transmission lines and transistors are arranged in a ladder configuration that forms a synthetic transmission line. The result is a system that advantageously absorbs the transistor capacitance into a broadband transmission line-like structure that can efficiently handle the necessary frequency range. Since a synthetic transmission line can operate from frequencies of 0 Hz up to some high cutoff frequency, systems designed around the distributed amplifier approach can achieve virtually an infinite amount of octave bandwidth.

However, a principle weakness of the distributed amplifier approach relates to the synthetic transmission line itself. There is always a residual passband ripple, the amplitude of which is determined by the upper cutoff frequency and the number of sections in the synthetic transmission line. That is, the passband ripple can be improved, but doing so requires the addition of more sections to the synthetic transmission line. However, the number of sections is limited by the space available for laying out the circuit. Accordingly, a compromise is forced between bandwidth, ripple, and layout size, and the results are not always satisfactory.

What is needed, therefore, is an amplifier that does not have significant passband ripple. What is also needed is a wideband, high frequency amplifier that can be fabricated with a smaller size.

SUMMARY

In an example embodiment, an amplifier comprises: a transistor, a gate load and a first line load. The transistor includes a gate line, a first line, and a second line. The gate line has an input terminal at a first end thereof, adapted to receive an input signal, and a gate line load terminal at a second end thereof. The gate line is a gate of the transistor, one of the first and second lines is a source of the transistor, and the other of the first and second lines is a drain of the transistor. The second line is connected to a first supply voltage. The first line includes a first line load terminal at a first end thereof, and an output terminal at a second end thereof, the output terminal being adapted to provide an output signal. A gate line load is connected between the gate line load terminal and a second supply voltage. A first line load is connected between the first line load terminal of the first line and a third supply voltage. The amplifier amplifies the input signal to produce the output signal.

In another example embodiment, a method is provided for amplifying a signal with a transistor comprising a gate line, a first line, and a second line, wherein one of the first and second lines is a source of the transistor, and the other of the first and second lines is a drain of the transistor. The method comprises: providing the signal to a first end of the gate line, the gate line having a first characteristic impedance; connecting the second line to a first voltage supply; connecting a gate line load between a second end of the gate line and a second voltage supply; connecting a first line load between a first end of the first line and a third voltage supply; and outputting an amplified signal at a second end of the first line.

In yet another example embodiment, a transmission line transistor amplifier comprises a gate line, a first line, and a second line. The gate line has an input terminal at a first end thereof, adapted to receive an input signal, and a gate line load terminal at a second end thereof, adapted to be connected to a gate line load. The gate line is a gate of the transistor, one of the first and second lines is a source of the transistor and the other of the first and second lines is a drain of the transistor. The second line is connected to a first supply voltage. The first line includes a first line load terminal at a first end thereof, that is adapted to be connected to a first line load, and an output terminal at a second end thereof, the output terminal being adapted to provide an output signal.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

In the description to follow, when it is said that two or more components or points are connected to each other, it should be understood that does not preclude the possibility of the existence of intervening elements or components. In contrast, when it is said that two or more components or points are directly connected to each other, it should be understood that the two components or points are connected without any intervening components or circuits that significantly affect a signal passed across the connection. However a conductive contact, wire, or line which does not present substantial capacitance, inductance, or resistance at frequencies of interest may be used to directly connect the two or more components or points. Also, as used herein, a "line" means something that is distinct, elongated, and relatively narrow. It can be curved, straight, or bent unless otherwise indicated. It is not to be construed in a strict mathematical sense as having no width, or as being generated by a moving point, unless otherwise specifically indicated.

Figure 1:
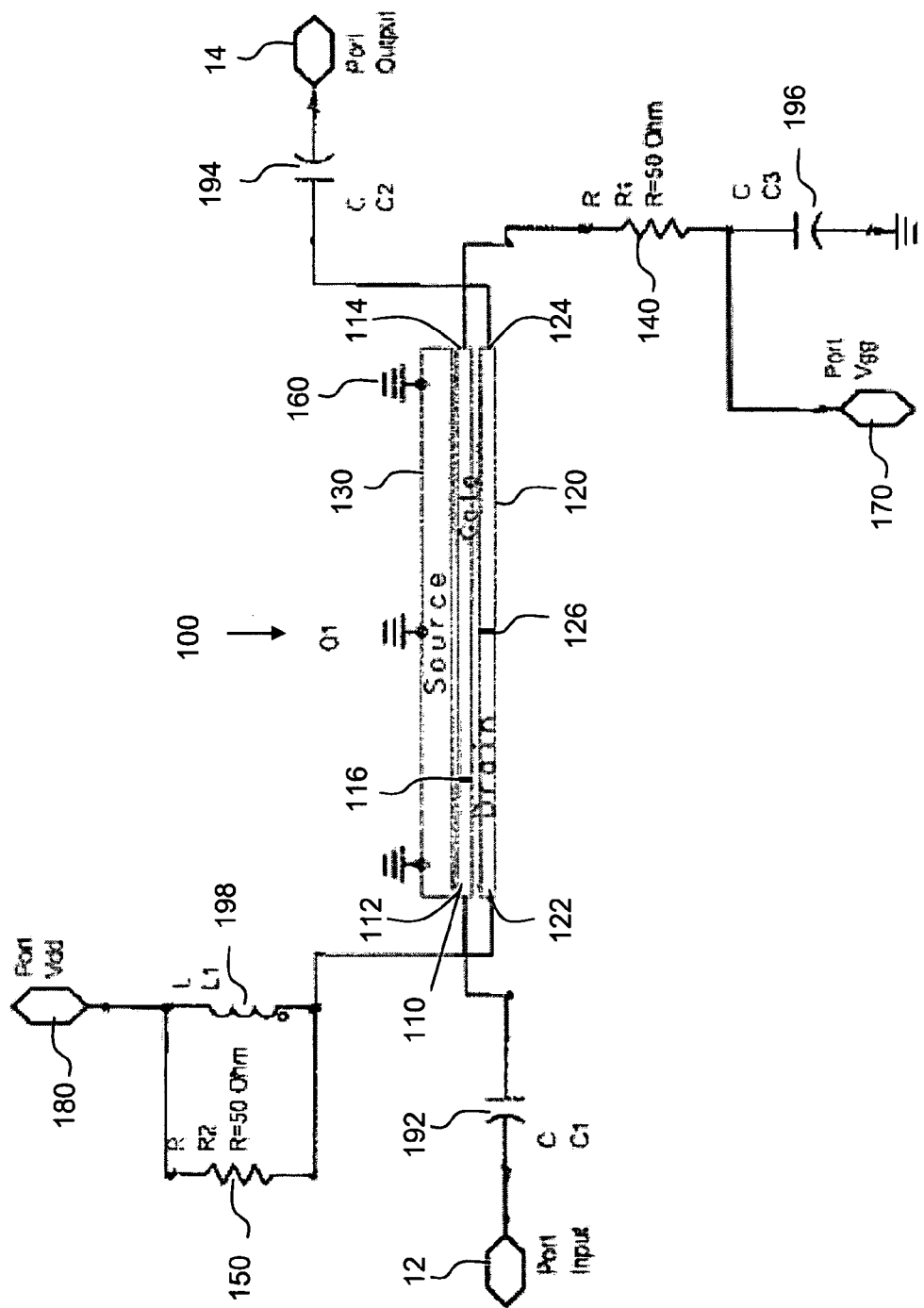
FIG. 1 shows a schematic diagram of one embodiment of a transmission line amplifier.

FIG. 1 shows a schematic diagram of one embodiment of a transmission line amplifier 10 having an input port 12 and an output port 14. Transmission line amplifier 10 includes: a field effect transistor (FET) 100, having a gate line 110, and first and second lines 120 and 130; a gate line load 140; and a first line load 150. Transmission line amplifier 10 further includes DC blocking capacitors 192 and 194, AC grounding capacitor 196, and high frequency choke 198, which may be an inductor, or a high impedance transmission line, depending upon the operating frequencies of amplifier 10. The elements 192, 194, 196, and 198 are important to the proper operation of amplifier 10, but may be supplied externally to the "core" of amplifier 10. Transistor 100 is connected to first, second, and third supply voltages 160, 170, and 180 as described in more detail below.

Gate line 110 functions as a gate for transistor 100. One of the first and second lines 120/130 functions as a source of transistor 100, and the other of the first and second lines functions as a drain of transistor 100. In the embodiment of FIG. 1, first line 120 is a drain, and second line 130 is a source, of transistor 100. Second line 130 (e.g., source of transistor 100) is directly connected to first supply voltage 160, which in the embodiment of FIG. 1 is ground.

Gate line 110 has a first end 112 and a second end 114 at opposite ends. Gate line 110 has a line width 116 which is designed to provide a desired characteristic impedance, as will be discussed in further detail below. An input terminal is provided at first end 112 of gate line 110, and is adapted to receive an input signal to be amplified by amplifier 10. A gate line load terminal is provided at second end 114 of gate line 110, and is a connected to a first end of gate line load 140. A second end of gate line load 140 is connected to second supply voltage 170, Vgg.

First line 120 has a first end 122 and a second end 124 at opposite ends. First line 120 has a line width 126 which is designed to provide a desired characteristic impedance, as will be discussed in further detail below. A first line load terminal is provided at first end 122 of first line 120 (e.g., drain of transistor 100), and is a connected through high frequency choke 198 and first line load 150 to third supply voltage 180, which is labeled Vdd. An output terminal is provided at second end 124 of first line 120, the output terminal being adapted to provide an output signal.

In one embodiment, first end 122 of first line 120 is aligned with first end 112 of the gate line 110, and second end 124 of first line 120 is aligned with second end 114 of gate line 110. Furthermore, in one embodiment gate line 110, first line 120, and second line 130 each extend in a straight line, all of the straight lines being parallel to each other. However, in other embodiments, gate line 110, first line 120, and second line 130 may not be straight lines, but may take on other shapes.

Operationally, an input signal is fed from input port 12 through DC blocking capacitor 192 to the input terminal at first end 112 of gate line 110. The source (second line 130) of transistor 100 is grounded. The gate of transistor 100 is biased at second end 114 of gate line 110 by second voltage supply 170, Vgg, through gate line load 140. AC grounding capacitor 196 insures that the node labeled Vgg remains at a good AC ground at frequencies of interest for amplifier 10, and is otherwise not needed. Meanwhile, the drain of transistor 100 is biased at first end 122 of first line 120 by third supply voltage 180, Vdd, through high frequency choke 198 and first line load 150. An amplified output signal is provided from the output terminal at second end 124 of first line 120, through DC blocking capacitor 194, to output port 14.

In one embodiment, gate line 110 and second (drain) line 120 each have a characteristic impedance of 50 ohms, i.e., they are each 50 ohm transmission lines at the desired operating frequencies, and the "system impedance" is 50 ohms. In that case, in order to insure a 50 ohm termination at each end of each transmission line, gate line load 140 and first line load 150 are provided, and in this case are each also 50 ohms. To achieve the desired 50 ohm characteristic impedance for gate line 110 and first (drain) line 120, line widths 116 and 126 must be carefully selected. A variety of methods are available to accomplish this, including E/M field solvers, analytical methods, and empirical methods. Of course 50 ohms is a common impedance for RF and microwave amplifiers, but it is only exemplary in the context of amplifier 10. Amplifier 10 may operate with an impedance of 75 ohms, or any other conveniently selected impedance.

Figure 2:
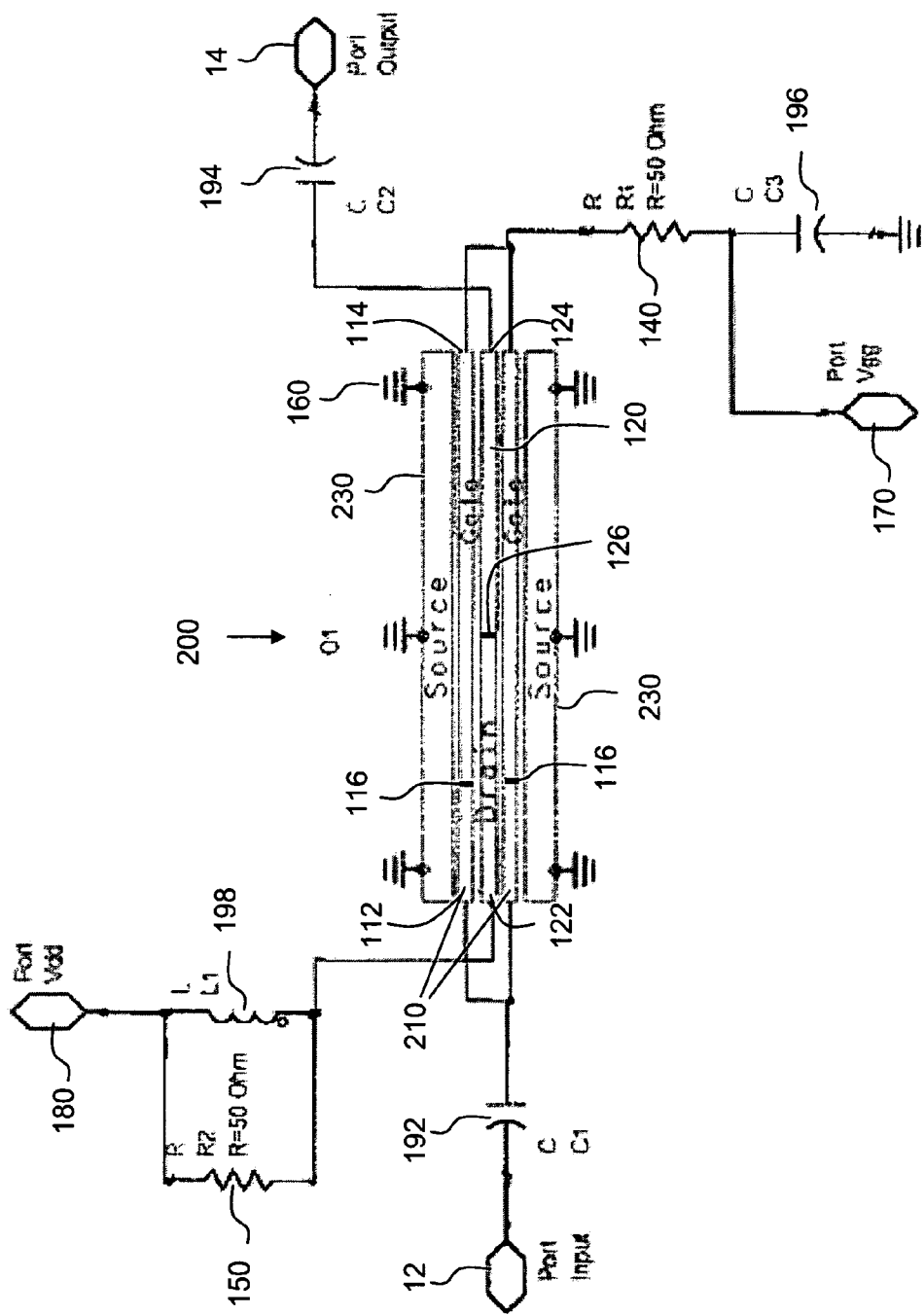
FIG. 2 shows a schematic diagram of another embodiment of a transmission line amplifier.

FIG. 2 shows a schematic diagram of another embodiment of a transmission line amplifier 20. In the embodiment of FIG. 2, amplifier 20 employs a two-finger FET 200, having a split gate line 210 and a split source line 230. However, it should be understood that other embodiments may employ FETs having different configurations. Otherwise, the construction and operation of amplifier 20 are similar to those of amplifier 10 of FIG. 1, described above, and will not be repeated here.

Figure 3:
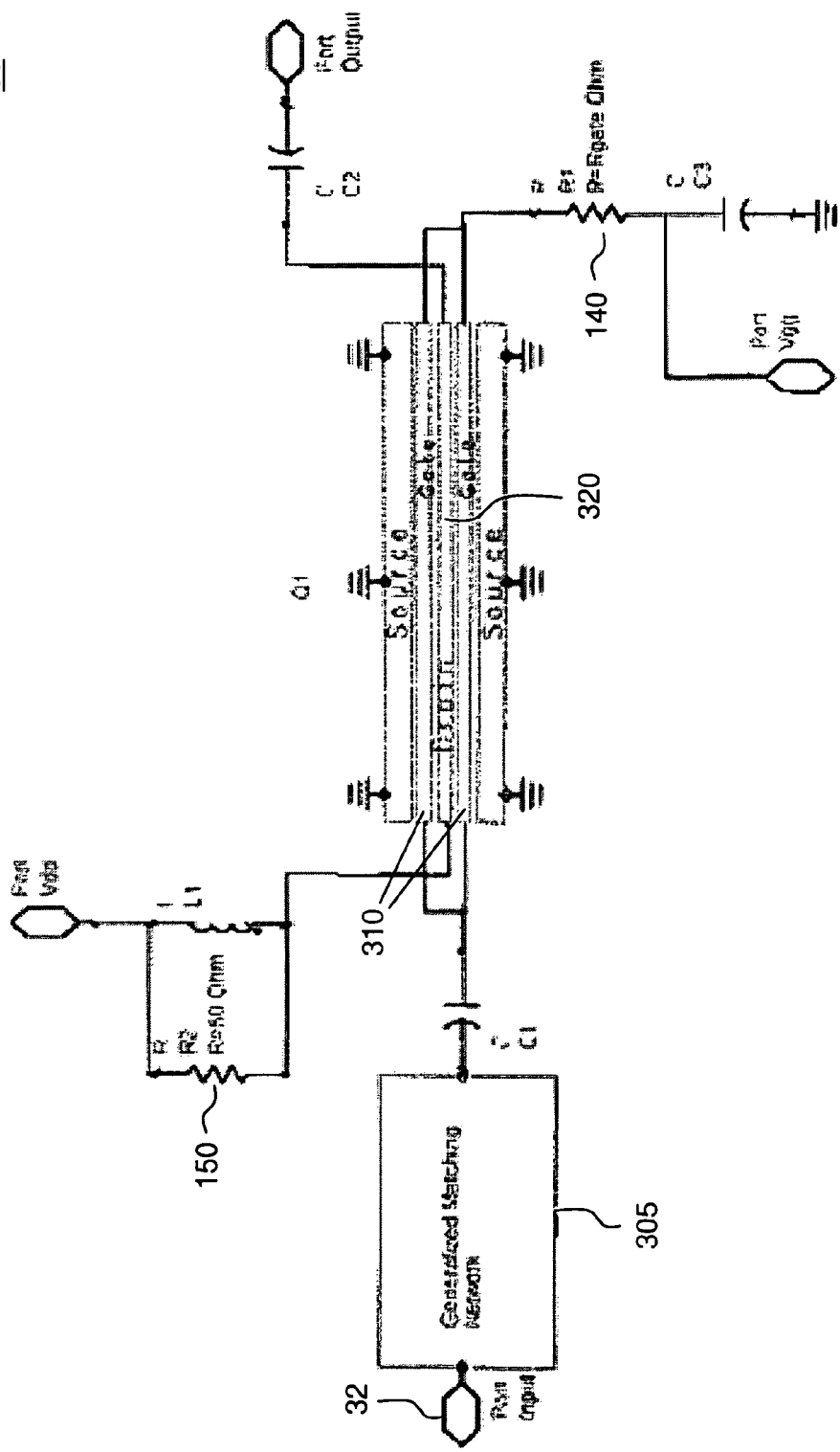
FIG. 3 shows a schematic diagram of yet another embodiment of a transmission line amplifier.

Should it prove difficult in a particular implementation to achieve the desired characteristic impedance for the gate line, FIG. 3 shows another embodiment of a transmission line amplifier 30 which employs a generalized matching network 305 between an input port 32 and DC blocking capacitor 192. In some embodiments, it may be possible to absorb DC blocking capacitor 192 into generalized matching network 305.

In the amplifier 30 of FIG. 3, gate line 310 has a characteristic impedance, Rgate, that differs from the impedance, Rin (e.g., 50 ohms), of a source of the input signal, connected to the input node 32. In that case, generalized matching network 305 matches the impedance Rin to the impedance Rgate at the frequencies of interest. Also, gate line load 140 is set to have an impedance, Rgate. Otherwise, the construction and operation of amplifier 30 are similar to those of amplifier 10 of FIG. 1, described above, and will not be repeated here.

Although FIG. 3 only shows a generalized matching network being employed at input node 32 for the input signal, it should be understood that, in general, a generalized matching network may be employed: (1) at input node 32 for the input signal, (2) at output node 34 for the output signal (e.g., when the characteristic impedance of first (e.g., drain) line 320, Rdrain, differs from the impedance, Rout of a next circuit to which the output signal is being provided); or (3) at both input node 32 and output node 34 for both the input and output signals. In each case, gate line load 140 and first line load 150 should each have an impedance which is the same as the characteristic impedance of gate line 310 and first line 320, respectively.

In the embodiments above, it should be understood that the amplifiers can be realized in a variety of ways, depending upon particular circumstances. For example, components such as the gate line load, first line load, and even DC blocking capacitors, AC bypass capacitor, and high frequency choke may be provided externally to a transmission line amplifier module comprising a transistor as described above or shown in any of the FIGS. 1-3.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An amplifier, comprising:
   a transistor, including,
      a gate line, having,
         an input terminal at a first end thereof, adapted to receive an input signal, and
         a gate line load terminal at a second end thereof,
      a first line, and
      a second line,
      wherein the gate line is a gate of the transistor, one of the first and second lines is a source of the transistor, and the other of the first and second lines is a drain of the transistor,
      wherein the second line is connected to a first supply voltage, and
      wherein the first line includes,
         a first line load terminal at a first end thereof, and
         an output terminal at a second end thereof, the output terminal being adapted to provide an output signal;
   a gate line load connected between the gate line load terminal and a second supply voltage; and
   a first line load connected between the first line load terminal of the first line and a third supply voltage,
   wherein the amplifier amplifies the input signal to produce the output signal.

2. The amplifier of claim 1, wherein the gate line and the first line have a same characteristic impedance as each other, and the gate line load and first line load have an impedance that is the same as the characteristic impedance.

3. The amplifier of claim 2, wherein the gate line and first line each have a characteristic impedance of 50 ohms.

4. The amplifier of claim 1, wherein the gate line has a first characteristic impedance, and the first line has a second characteristic impedance different from the first characteristic impedance.

5. The amplifier of claim 4, further comprising a generalized matching network connected to the gate line input terminal matching an input signal to the first characteristic impedance.

6. The amplifier of claim 5, wherein the gate line load has a same impedance as the first characteristic impedance.

7. The amplifier of claim 5, further comprising a second generalized matching network connected to the first line output terminal matching an output signal to the second characteristic impedance.

8. The amplifier of claim 7, wherein the first line load has a same impedance as the second characteristic impedance.

9. The amplifier of claim 4, further comprising a generalized matching network connected to the first line output terminal matching an output signal to the second characteristic impedance.

10. The amplifier of claim 9, wherein the first line load has a same impedance as the second characteristic impedance.

11. A method of amplifying a signal with a transistor comprising a gate line, a first line, and a second line, wherein one of the first and second lines is a source line and the other of the first and second lines is a drain line, the method comprising:
   providing the signal to a first end of the gate line, the gate line having a first characteristic impedance;
   connecting the second line to a first voltage supply;
   connecting a gate line load between a second end of the gate line and a second voltage supply;
   connecting a first line load between a first end of the first line and a third voltage supply; and
   outputting an amplified signal at a second end of the first line.

12. The method of claim 11, wherein connecting a gate line load between a second end of the gate line and a second voltage supply comprises connecting a gate line load having a same impedance as a characteristic impedance of the gate line between a second end of the gate line and a second voltage supply, and wherein connecting a first line load between a first end of the first line and a third voltage supply comprises connecting a first line load having a same characteristic impedance of the first line between a first end of the first line and a third voltage.

13. The method of claim 12, wherein the gate line load has a different impedance from the first line load.

14. The method of claim 11, wherein providing the signal to a first end of the gate line comprises passing the signal through a generalized matching network connected to the first end of the gate line, the generalized matching network matching the signal to a characteristic impedance of the gate line.

15. A transmission line transistor amplifier, comprising:
   a gate line, having,
      an input terminal at a first end thereof, adapted to receive an input signal, and
      a gate line load terminal at a second end thereof, adapted to be connected to a gate line load;
   a first line; and
   a second line;
   wherein the gate line is a gate of the transistor, one of the first and second lines is a source of the transistor and the other of the first and second lines is a drain of the transistor,
   wherein the second line is connected to a first supply voltage, and
   wherein the first line includes,
      a first line load terminal at a first end thereof and being adapted to be connected to a first line load, and
      an output terminal at a second end thereof and being adapted to provide an output signal.

16. The amplifier of claim 15, wherein the gate line and the first line have a same characteristic impedance as each other, and the gate line load and first line load have an impedance that is the same as the characteristic impedance.

17. The amplifier of claim 16, wherein the gate line and first line each have a characteristic impedance of 50 ohms.

18. The amplifier of claim 15, wherein the gate line has a first characteristic impedance, and the first line has a second characteristic impedance different from the first characteristic impedance.

19. The amplifier of claim 15, wherein the gate line, first line, and second line each extend in a straight line, all of the straight lines being parallel to each other.

* * * * *